United States Patent [19]
Valster et al.

[11] Patent Number: 5,805,630
[45] Date of Patent: Sep. 8, 1998

[54] OPTOELECTRONIC SEMICONDUCTOR DEVICE WITH AN ARRAY OF SEMICONDUCTOR DIODE LASERS AND METHOD OF MANUFACTURING SUCH A DEVICE

[75] Inventors: Adriaan Valster; Carolus J. Van Der Poel; Jeroen J. L. Horikx, all of Eindhoven, Netherlands

[73] Assignee: U.S. Philips Corporation, New York, N.Y.

[21] Appl. No.: 273,528

[22] Filed: Jul. 11, 1994

[30] Foreign Application Priority Data

Jul. 12, 1993 [BE] Belgium .................................. 0930017

[51] Int. Cl.$^6$ ........................................................ H01S 3/18
[52] U.S. Cl. ................................................. 372/50; 257/93
[58] Field of Search ............................ 372/50, 43; 257/93

[56] References Cited

U.S. PATENT DOCUMENTS 5,033,053  7/1991  Shimizu et al. ............................ 372/50

FOREIGN PATENT DOCUMENTS

| 57-190384 | 11/1982 | Japan | 372/50 |
|---|---|---|---|
| 60-242686 | 4/1986 | Japan . | |
| 61-168985 | 7/1986 | Japan | 372/50 |
| 62-042592 | 7/1987 | Japan . | |
| 1-53488 | 3/1989 | Japan | 372/50 |
| 1-243490 | 9/1989 | Japan | 372/50 |
| 1-260878 | 10/1989 | Japan | 372/50 |
| 1-273378 | 11/1989 | Japan | 372/50 |
| 2122584 | 5/1990 | Japan . | |

OTHER PUBLICATIONS

Translation of Shiomoto (1–273378), Nov. 1, 1989.

*Primary Examiner*—Rodney B. Bovernick
*Assistant Examiner*—Yisun Song
*Attorney, Agent, or Firm*—Brian J. Wieghaus

[57] ABSTRACT

An array of semiconductor diode lasers (11, 12) is a very suitable radiation source for various applications such as optical read and write systems and laser printers. Such an array includes a semiconductor body (10) with a substrate (1) and a layer structure provided thereon in which at least two lasers (11, 12) are formed which are mutually separated by a groove (20). In the known array, the groove (20) reaches down into the substrate (1), so that the lasers (11, 12) are electrically separated from one another. According to the invention, the array of lasers (11, 12) is provided with a groove (20) with a major portion (d) of its depth (D) which is situated within the substrate (1). As a result of this, the lasers (11, 12) of the array show a surprisingly low crosstalk. Preferably, the portion (d) of the groove (20) situated in the substrate (1) is at least 3 μm deep. The best results are obtained with depths (d) of approximately 10 up to at most 40 μm. In a very favorable embodiment, the device is provided at the upper side with a comparatively thick electrically and thermally conducting layer. In a preferred embodiment, the groove (20) is formed by reactive ion etching so that the groove (20) can be narrow and deep and the lasers (11, 12) will lie close together. A plasma including $SiCl_4$, Ar and $CH_4$ forms a particularly suitable etchant for lasers (11, 12) in the InGaP/InAlGaP material system.

20 Claims, 2 Drawing Sheets

OPTOELECTRONIC SEMICONDUCTOR DEVICE WITH AN ARRAY OF SEMICONDUCTOR DIODE LASERS AND METHOD OF MANUFACTURING SUCH A DEVICE

BACKGROUND OF THE INVENTION

The invention relates to an optoelectronic semiconductor device comprising an array of at least a first and a second semiconductor diode laser—often referred to as laser for short hereinafter—with a semiconductor body which comprises a semiconductor substrate of a first conductivity type on which a semiconductor layer structure is situated which comprises at least in that order: a first cladding layer of the first conductivity type, an active layer in which a first and a second active region of the first and the second laser, respectively, are present, and a second cladding layer of a second conductivity type opposed to the first, the first and the second cladding layer being provided with means for electrical connection of the first and the second laser which are mutually separated by a groove which extends from the surface of the semiconductor body down into the substrate.

Such a device is particularly suitable for use, for example, in a system for optical glass fiber communication in which the lasers of the array can act as radiation sources for two parallel glass fibers. The first laser of the array may be used for writing in an optical disc system while the second may be used for reading of the information. Such a device may also be advantageously used in a laser printer. Thanks to the presence of two lasers, a larger portion of a character to be printed can be pictured in a single line movement of the device than if the device were to contain only one laser.

Such a device with radiation-emitting diodes is known from JP(A)2-122584 published in Patent Abstracts of Japan, vol. 14, no. 348 (E-957)[4291] on Jul. 27th 1990. The device described therein comprises an array of three AlGaAs lasers on an n-type GaAs substrate which are separated from one another by a groove which extends from the surface of the semiconductor body down into the substrate.

A disadvantage of the known device is that the lasers are not optimally separated from one another. When the device is used, crosstalk between two (adjoining) lasers is observed. This means that, when the voltage across one laser is raised so as to increase the current through and the optical power of this laser, it is observed that the optical power of an adjoining laser changes. This latter effect is undesirable in many applications.

SUMMARY OF THE INVENTION

The present invention has for its object inter alia to provide an optoelectronic device with an array of lasers which does not have the said disadvantage, or at least to a much lesser degree, and in which no or at least much less crosstalk takes place between (adjoining) lasers during use than in the known device.

According to the invention, an optoelectronic device of the kind mentioned in the opening paragraph is for this purpose characterized in that a major portion of the groove is situated within the substrate. It has been found that, when a major portion of the groove, by which is meant in practice at least approximately half the groove, is situated within the substrate, the crosstalk between adjoining lasers is considerably reduced during use of the device to a level which is acceptable for many applications, such as in a laser printer.

The invention is based on the recognition that it is not sufficient to form the groove to beyond the pn junction, i.e. into the first cladding layer or into the substrate, in order to achieve a low crosstalk. It is true that two lasers are electrically separated in this manner, but too much crosstalk still remains. It has been found that the remaining crosstalk does not arise through optical interaction between (adjoining) lasers. It was surprisingly found that the remaining crosstalk in the known device is of an essentially thermal nature. This means that the temperature change which occurs in a laser when the setting thereof is changed results in a considerable temperature change of an adjoining laser, and thus in a change in the optical power generated in the latter laser. It has also been found that the groove must be so deep that the distance from the active layer to the bottom of the groove is at least approximately 4 $\mu$m when an appreciable decrease in the crosstalk is desired. It has also become apparent in this connection that no disadvantageous temperature change, and thus no excessive drift in the adjustment occur in the laser whose setting is purposely changed in spite of the thermally insulating power of such a comparatively deep groove. This is an important advantage because the adjustment of each laser can take place quickly and in a stable manner as a result of this. Thanks to the low crosstalk, the adjustment of an adjoining laser also remains stable then.

It is an important advantage of the device according to the invention, finally, that it can also be effectively used in the so-called "epi-up" mounting system. This means that the device is mounted with its substrate side on a carrier body or cooling body. "Epi-down" mounting is very complicated in the case of an array because of the necessary mutual electrical insulations of the lasers of the array.

A favorable embodiment of a device according to the invention is characterized in that the portion of the groove situated within the substrate is at least approximately 3 $\mu$m deep. The usual thickness of the semiconductor layer structure in which the lasers are formed is approximately 3 to 4 $\mu$m. The active layer is then approximately 1 $\mu$m above the substrate. When the portion of the groove lying within the substrate is at least approximately 3 $\mu$m deep, the distance from the active layer and thus the distance from the active regions to the bottom of the groove is at least approximately 4 $\mu$m. It has been found with such a depth of the portion of the groove lying in the substrate that the crosstalk between adjoining lasers can decrease by a maximum of approximately 10%, while the temperature of the laser whose power setting is changed, the so-called droop, becomes at most approximately 5% higher than if no or only a shallow groove were present. In a particularly favorable modification, the depth of the portion of the groove situated within the substrate is at least approximately 10 $\mu$m. In that case, the crosstalk may be up to 30% lower than in the case of no or only a shallow groove. The temperature rise of the laser whose emission power is purposely changed (droop) in this case is at most 10%.

Preferably, the depth of the portion of the groove situated within the substrate is at most approximately 40 $\mu$m. With this depth, the maximum crosstalk is no more than 20% of the crosstalk in the absence of a groove or with a shallow groove. The temperature rise of the laser whose setting is changed is at most approximately 20% higher with such a groove depth than that in the absence of a groove or with a groove of small depth. So the advantage in the form of a further reduction in crosstalk becomes increasingly smaller with greater groove depths, while the disadvantage of the progressive temperature rise of the switched laser becomes greater.

In favorable modifications, the distance between the first active region and the second active region is approximately 15 to 50 μm. The invention offers the greatest advantages, i.e. the lowest crosstalk, in the case of a small distance between the active regions. Distances smaller than approximately 15 μm are less suitable on practical grounds, such as the manufacturing possibilities. Preferably, the groove is as narrow as possible. Preferably, the groove width lies between approximately 5 μm and a width which is approximately 10 μm smaller than the distance between the active regions. The distance from an active region to the wall of the groove must be at least 2 μm, while also the necessary dimensional tolerances inherent in manufacture restrict the minimum groove width.

A minimum distance between the active regions has a very favorable effect on the crosstalk and an unfavorable effect on the droop. A minimum width of the groove has an unfavorable effect on the crosstalk an a very favorable effect on the droop. Optimum properties are found for a comparatively small distance between the active regions and a comparatively small groove width.

A preferred embodiment of the device according to the invention is characterized in that the groove is formed by means of reactive ion etching. The grooves thus obtained can be narrow, deep—for example, a few tens of micrometers deep—and steep. As a result, the active regions of the device according to the invention can lie as close together as possible. This is highly desirable for many applications but it is also true—as noted above—that the advantage of a comparatively deep groove is greatest then.

In a further modification, a current-blocking layer is present below the first cladding layer or on the second cladding layer, which current-blocking layer is interrupted at the areas of the active regions. This modification comprises lasers of the gain-guided type as well as of the index-guided type. In the former case, the two cladding lasers are comparatively thick (approximately 0.8 μm thick), in the latter case the portion of a cladding layer adjoining the blocking layer is comparatively thin (approximately 0.2 to 0.4 μm), while said cladding layer widens out into the recess of the blocking layer to achieve a great thickness (approximately 0.8 μm thick). InGaP/InAlGaP forms a very suitable material system for a device according to the invention because the wavelength of the laser emission then lies approximately between 700 and 600 nm. This wavelength range is very suitable for application of the device in, for example, laser printers.

In a very favorable embodiment, the surface of the semiconductor body is provided with a comparatively thick, preferably 2 to 6 μm thick, electrically and thermally conducting layer, such as a metal layer. Such a conducting layer has a favorable influence on the crosstalk: a reduction in the crosstalk by approximately 30% was observed in the case of a 3 μm thick gold layer. The temperature rise of a laser whose adjustment is changed is reduced thereby: a reduction of approximately 25% in this temperature rise was observed compared with the situation without a thick conducting layer. This implies that the optimum groove depth shifts to higher values, whereby the crosstalk may be reduced still further. This embodiment, furthermore, is particularly suitable for the epi-up mounting system referred to above.

In a method of manufacturing a device according to the invention, the desired groove in the device is formed to such a depth that the major portion of the groove lies within the substrate. Devices according to the invention are obtained in a simple manner thereby, for example, through etching. Preferably, the grooves are formed by means of reactive ion etching. Very narrow, steep and deep grooves can be manufactured thereby, with which particularly favorable devices according to the invention are obtained. In a preferred embodiment, the plasma used in the reactive ion etching process is generated in a gas mixture which comprises $SiCl_4$, Ar and $CH_4$, preferably 25 to 30 vol. % $SiCl_4$ and 20 to 25 vol. % $CH_4$. Deep and steep grooves can be etched very well with such a plasma into a layer structure of GaAs and InAlGaP. Such a layer structure forms part of lasers formed in the InGaP/InAlGaP material system.

BRIEF DESCRIPTION OF THE DRAWING

The invention will now be explained in more detail with reference to an embodiment and the accompanying drawing, in which.

Figure 1:
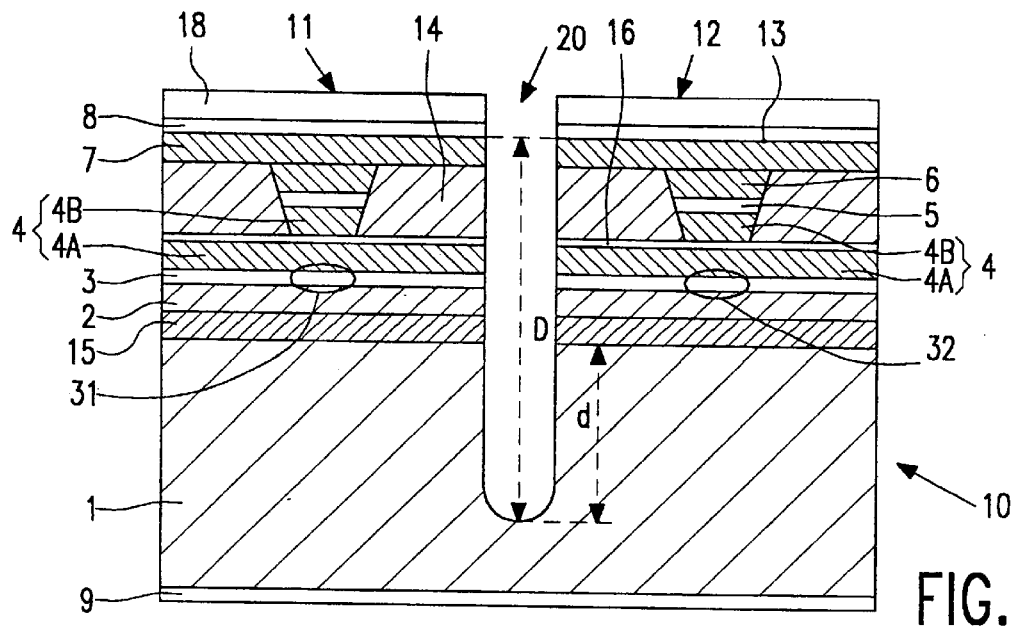
FIG. 1 is a cross-section of an embodiment of a device comprising an array of semiconductor diode lasers according to the invention.
Figure 2:
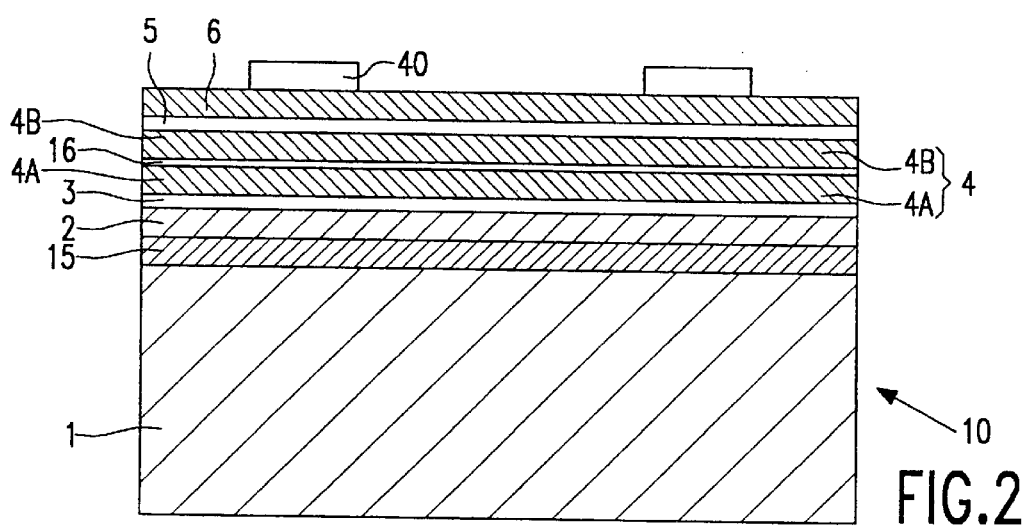
FIGS. 2 to 5 show the device of FIG. 1 in consecutive stages of manufacture by a method according to the invention.
Figure 3:
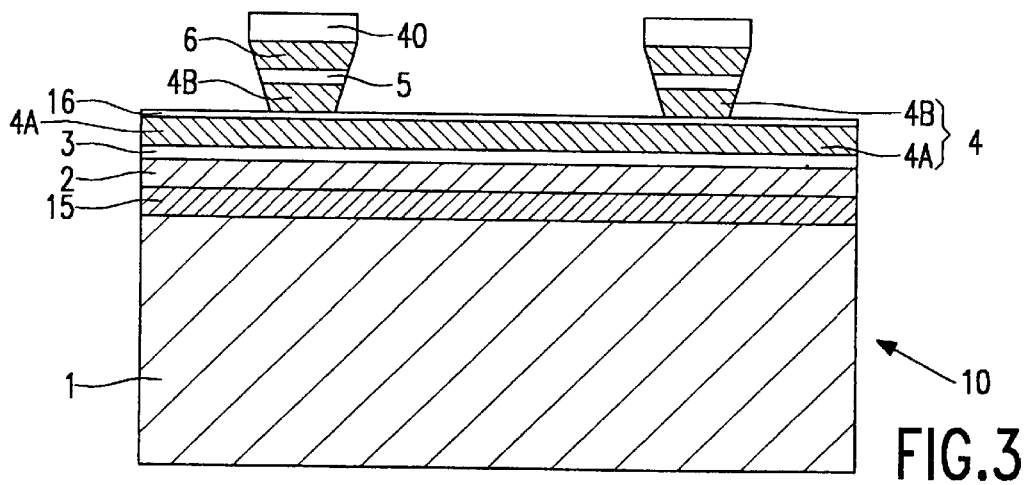
Figure 4:
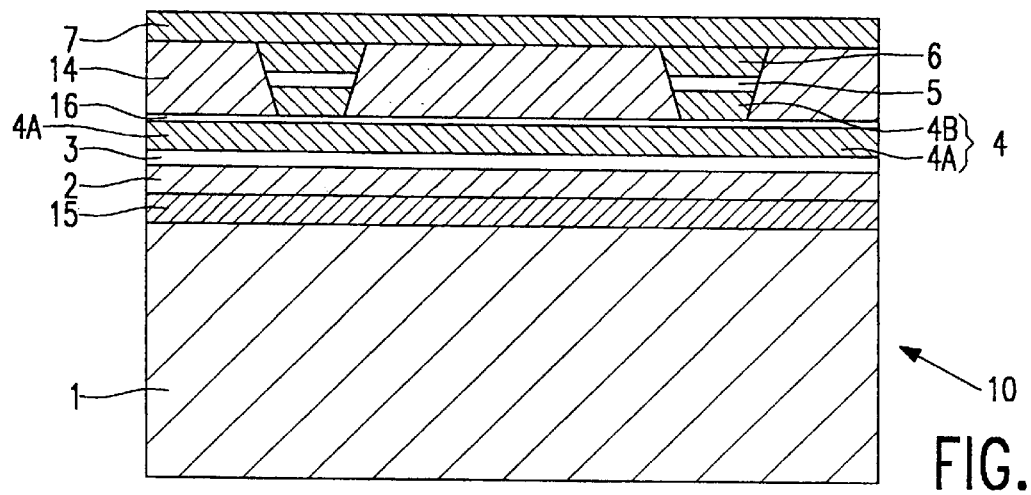
Figure 5:
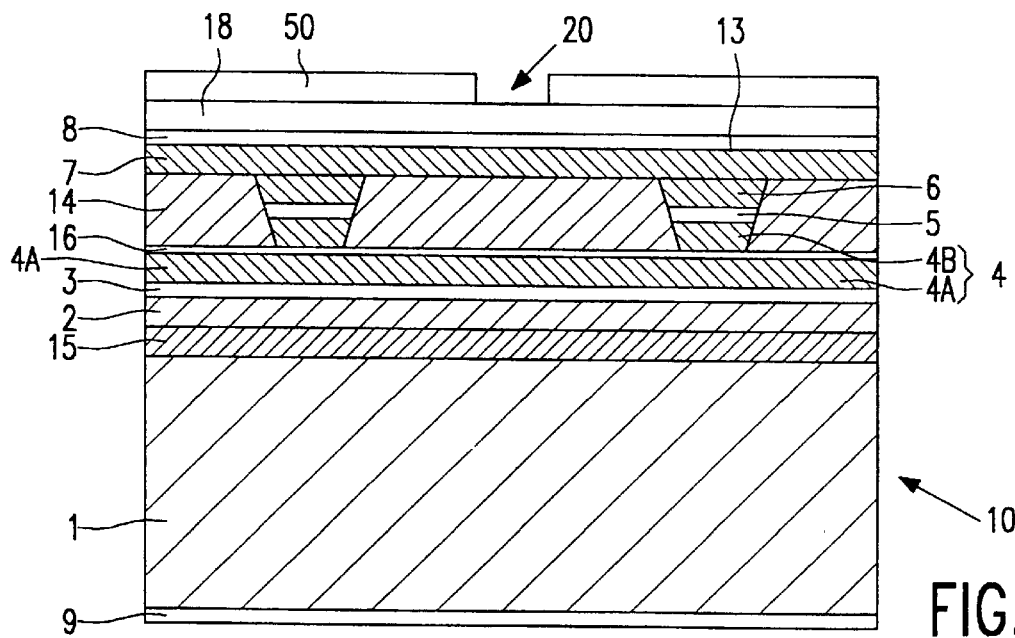

The Figures are diagrammatic and not drawn to scale, while in particular the dimensions in the thickness direction are exaggerated for greater clarity. Corresponding parts in the various examples are generally given the same reference numerals. Semiconductor regions of the same conductivity type are generally hatched in the same direction.

DESCRIPTION OF THE PREFERRED EMBODIMENTS

FIG. 1 shows in cross-section a first embodiment of a device according to the invention, here with an array of two lasers 11, 12 and with a semiconductor body 10. The cross-section is taken perpendicular to the longitudinal direction of the resonance cavity of the laser. The semiconductor body 10 comprises a substrate 1 of a first, here the n-conductivity type which is provided with a connection conductor 9 and which in this example consists of monocrystalline gallium arsenide. On this body is provided a semiconductor layer structure which comprises inter alia: a buffer layer 15 of n-AlGaAs, a first cladding layer 2 of n-InAlGaP, an active layer 3 of InGaP, a second cladding layer 4 of p-InAlGaP which here comprises portions 4A, 4B which are mutually separated by a thin etching stopper layer 16 of InGaP. Within the active layer 3 there are a first active region 31 and a second active region 32 which correspond to the first laser 11 and the second laser 12, respectively. The means for electrical connection of the lasers 11, 12 further comprise a thin InGaP intermediate layer 5, a first p-type GaAs contact layer 6, a second p-type GaAs contact layer 7, and a connection conductor 8. The lasers 11, 12 are separated from one another by a groove 20 which extends from the surface 13 of the semiconductor body 10 down into the substrate 1. According to the invention, the device is characterized in that the groove 20 is situated with a major portion d, here approximately half, of its depth D within the substrate 1. The groove 20 in this example has a depth D of approximately 7 μm, while the portion d thereof situated within the substrate 1 has a depth of approximately 4 μm. The semiconductor layer structure is approximately 3 μm thick here, as is often the case in practice. A groove 20 extending less far down into the substrate 1 achieves a sufficient electrical separation between the lasers 11, 12 and thus reduces the crosstalk between the lasers 11, 12. This crosstalk, however, is found to be dominated by thermal crosstalk. It was found that a groove according to the invention results in a very small crosstalk between the first 11 and the second 12 semiconductor diode laser. The crosstalk of the device of the present example is found to be lower than 4%. It is also surprisingly found that the insulating effect of a groove 20 according to the invention still has a fully acceptable influence on the adjustment characteristics of the two lasers 11, 12 themselves. A very attractive reduction in the crosstalk occurs when the portion d of the groove 20 situated within the substrate 1 is greater than approximately 10 μm. Also with such a groove, substantially no adverse influence on the adjustment characteristics of the lasers 11, 12 takes place. Such an adverse influence only occurs when the portion d of the groove 20 situated within the substrate 1 becomes greater than approximately 40 μm. The distance between the active regions 31, 32 is approximately 25 μm here and the width of the groove 20 is approximately 10 μm. The groove 20 is formed by means of reactive ion etching here. As a result of this, the groove 20 can be not only deep—approximately 7 μm here—but also narrow, and the distance between the active regions 31, 32 may be as small as possible, which is highly desirable.

On the second cladding layer 4, at least on the portion 4A thereof, a current-blocking layer 14 is present here, which comprises n-GaAs in this case and which is interrupted at the areas of the active regions 31, 32. Owing to the fact that the portion 4A of the second cladding layer 4 is thin, approximately 0.2 μm here, and the fact that the portion 4B of the second cladding layer 4 bulges out into the interruptions of the blocking layer 14 at the areas of the active regions 31, 32, the lasers 11, 12 of the device in this example are of the index-guided type. The width of the active regions 31, 32 is substantially defined by the width of the portions 4B of the second cladding layer 4, which are approximately 4 μm wide here. The materials chosen in this example for the various semiconductor layers were chosen from the InGaP/InAlGaP material system, so that the device is particularly suitable for use inter alia in a laser printer.

In this example, a comparatively thick metal layer 18, here an approximately 3 μm thick Au layer, is provided on the connection conductor 8, so that the lasers 11, 12 are better cooled at the upper side. The said adverse effect of a deep groove 20 on the adjustment characteristic of each of the lasers 11, 12 is limited by this. Such a metal layer has practically no adverse influence on the crosstalk between the lasers 11, 12. The etching stopper layer 16 situated between the portions 4A and 4B of the second cladding layer has a small thickness, approximately 10 μm in this case, and comprises InGaP with an indium content of approximately 40 at. %. The InGaP intermediate layer 6 splits up the step in the bandgap between the second cladding layer 4 and the contact layers 6 and 7, which promotes a good current-voltage characteristic of the lasers 11, 12. The lasers 11, 12 are provided with electrical connections (not shown in the Figures) which are separate at the upper side and shared at the substrate side.

The conducting layer 9 here is a layer comprising gold, germanium and nickel with a thickness of approximately 0.1 μm, the conducting layer 8 in this example comprises a platinum, a tantalum, and a gold layer with thicknesses of approximately 0.1, approximately 0.05, and approximately 0.25 μm, respectively. The metal layer 8 is an approximately 3 μm thick electrolytically applied Au layer. The following compositions, dopings, and thicknesses were used for the various semiconductor layers in the present example, in as far as they have not been mentioned earlier.

| Layer | Semiconductor | Type | Doping-concentr [at/cm$^3$] | Thickness [μm] | Bandgap (bulk) [eV] |
|---|---|---|---|---|---|
| 1 | GaAs (substrate) | N | $2 \times 10^{18}$ | 150 | 1,4 |
| 15 | Al$_{0,2}$Ga$_{0,8}$As | N | $2 \times 10^{18}$ | 0,1 | 1,7 |
| 2 | In$_{0,50}$Al$_{0,35}$Ga$_{0,15}$P | N | $5 \times 10^{17}$ | 0,8 | 2,2 |
| 3 | In$_{0,49}$Ga$_{0,51}$P | — | — | 0,1 | 1,9 |
| 4A | In$_{0,50}$Al$_{0,35}$Ga$_{0,15}$P | P | $3 \times 10^{17}$ | 0,2 | 2,2 |
| 16 | In$_{0,40}$Ga$_{0,60}$P | P | $1 \times 10^{18}$ | 0,01 | 2,1 |
| 4B | In$_{0,50}$Al$_{0,35}$Ga$_{0,15}$P | P | $3 \times 10^{17}$ | 0,8 | 2,2 |
| 5 | In$_{0,49}$Ga$_{0,51}$P | P | $1 \times 10^{18}$ | 0,01 | 1,9 |
| 6 | GaAs | P | $2 \times 10^{18}$ | 0,1 | 1,4 |
| 7 | GaAs | P | $2 \times 10^{18}$ | 0,5 | 1,4 |
| 14 | GaAs | N | $2 \times 10^{18}$ | 0,5 | 1,4 |

FIGS. 2 to 5 show the device of FIG. 1 in consecutive stages of manufacture by a method according to the invention. The method starts (see FIG. 2) with a (001) substrate 1 of monocrystalline n-type gallium arsenide. After polishing and etching of the surface having the (001) orientation, the following semiconductor layer structure is provided thereon in the present example from the gas phase by means of MOVPE (=Metal Organic Vapour Phase Epitaxy) and at a growing temperature of 760° C.: first a buffer layer 15 of AlGaAs. Then a first cladding layer 2 of InAlGaP, an active layer 3 of InGaP, a first portion 4A of a second cladding layer 4 of InAlGaP, an etching stopper layer 16 of InGaP, a second portion 4B of the second cladding layer 4, an intermediate layer 5 of InGaP, and a first contact layer 6 of GaAs. For the choice of composition, conductivity type, doping concentration, thickness, and bandgap of the semiconductor layers the reader is referred to the Table included above and the description of FIG. 1. After the structure has been removed from the growing apparatus, a 0.1 μm thick insulating layer 14 of silicon dioxide is provided thereon, for example, by sputtering. Two strips 40 are formed therein by photolithography and etching with a width of approximately 5 μm, an interspacing of approximately 25 μm, and with a longitudinal axis perpendicular to the plane of drawing of FIG. 2.

After this (see FIG. 3) the portions of the contact layer 6, the intermediate layer 5 and the portion 4B of the second cladding layer situated outside the masks 40 are removed by etching with suitable etchants, after which the etching stopper layer 16 becomes active as such. After cleaning of the structure, it is returned to the growing apparatus and a blocking GaAs layer is selectively provided on either side of the masks 40. After removal from the growing apparatus, the masks 40 are removed and the device is put in the growing apparatus again where a second GaAs contact layer 7 is provided (see FIG. 4). After removal from the growing apparatus and cleaning of the device, the conducting layers 8 and 9 are provided, for example, by sputtering. A thick Au layer 18 is provided on the conducting layer 8 by means of electrolytic deposition, and on that (see FIG. 5) a photoresist layer 50 is provided with a strip-shaped opening at the area of the groove 20 to be formed in the device.

Then, according to the invention (see FIG. 1), a groove is formed, here by reactive ion etching, to such a depth that a major portion d of the depth D of the groove 20 is present within the substrate 1. The highly attractive optoelectronic devices according to the invention are obtained thereby after the device has been cleft in two places. A narrow and deep groove 20 may be readily formed by the use of reactive ion etching. In the example given, the reactive ion etching treatment preferably employs a gas mixture comprising SiCl$_4$, Ar and CH$_4$, preferably 25 to 30 vol. % SiCl$_4$ and 20 to 25 vol. % CH$_4$. The desired groove 20 can be very well formed in this manner in the InGaP/InAlGaP material system in which etching takes place through one or more layers comprising indium, such as the cladding layers 2, 4 in this case, the active layer 3, and the intermediate layer 5 above which one or several layers comprising GaAs are present, such as the contact layers 6 an 7 here. It is noted that etching of the groove 20 may also take place before the conductive layers 8, 9 and 18 are provided.

The invention is not limited to the embodiments given since many modifications and variations are possible to those skilled in the art within the scope of the invention. Thus different compositions of the chosen semiconductor materials or different thicknesses from those mentioned in the example may be used. In particular, the active layer may advantageously comprise a (multi)quantum well layer structure. The device according to the invention may be advantageously formed in the GaAs/AlGaAs or InGaAsP/InP material systems instead of in the InGaP/InAlGaP material system. It is also possible to replace the conductivity types all (simultaneously) by their opposites. Alternative structures may also be used, possibly of a guiding type different from the gain-guided type. Lasers of the oxide stripe type are an example of this. It should finally be noted that the methods of providing the semiconductor layers in the embodiment may be others than the MOVPE technology. Thus, instead of MOVPE, use may be made of MOMBE (=Metal Organic Molecular Beam Epitaxy), MBE (=Molecular Beam Epitaxy), VPE (=Vapor Phase Epitaxy) or LPE (=Liquid Phase Epitaxy).

We claim:

1. An optoelectronic semiconductor device comprising an array of at least a first and a second semiconductor diode laser and with a semiconductor body which comprises a semiconductor substrate of a first conductivity type on which a semiconductor layer structure is situated which comprises at least in that order: a first cladding layer of the first conductivity type, an active layer in which a first and a second active region of the first and the second laser, respectively, are present, and a second cladding layer of a second conductivity type opposed to the first, the first and the second cladding layer being provided with means for electrical connection of the first and the second laser which are mutually separated by a groove which extends from the surface of the semiconductor body down into the substrate, characterized in that: the groove defines an empty void, has a depth (D), is situated within the substrate for a major portion (d) of its depth (D) and in that the major portion (d) of the groove situated within the substrate is at most approximately 40 µm deep.

2. An optoelectronic semiconductor device as claimed in claim 1, characterized in that the portion (d) of the groove (1) situated within the substrate (1) is at least approximately 3 µm deep.

3. An optoelectronic semiconductor device as claimed in claim 1, characterized in that the portion (d) of the groove (1) situated within the substrate (1) is at least approximately 10 µm deep.

4. An optoelectronic device as claimed in claim 1, characterized in that the distance from the first (32) to the second (32) active region is between approximately 15 and 50 µm, and the width of the groove lies between approximately 5 µm and a width which is approximately 10 µm smaller than the distance between the first (32) and second (32) active region.

5. An optoelectronic semiconductor device as claimed in claim 1, characterized in that the groove has steep sidewalls and is formed by means of reactive ion etching.

6. An optoelectronic semiconductor device as claimed in claim 1, characterized in that a current-blocking layer (14) is present on the second cladding layer, which current-blocking layer is interrupted at the areas of the first and second active regions.

7. An optoelectronic semiconductor device as claimed in claim 1, characterized in that the cladding layers comprise InAlGaP, the active layer comprises one of InGaP and InAlGaP, and the substrate and a contact layer present on the second cladding layer comprise GaAs.

8. An optoelectronic semiconductor device as claimed in claim 1, characterized in that the means for electrical connection which are present on the surface of the semiconductor body comprise a 2 to 6 µm thick, metal layer.

9. A method of manufacturing an optoelectronic semiconductor device which comprises an array of at least two semiconductor diode lasers, whereby a semiconductor body is formed, comprising the steps of providing a semiconductor layer structure on a semiconductor substrate, the layer structure comprising in that order a first cladding layer of a first conductivity type, an active layer and a second cladding layer of a second conductivity type opposed to the first, then providing the cladding layers with means for electrical connection and forming a groove in the semiconductor body extending from the surface down into the substrate, and forming a first and a second active region on either side of said groove in the active layer, characterized in that: the groove is formed so deep that a major portion of the groove is situated within the substrate, in that the major portion of the groove situated within the substrate is at most 40 µm deep, and the groove is not filled with material so as to define an empty void which provides thermal isolation between the respective substrate portions of the first and second active regions.

10. A method as claimed in claim 9, characterized in that the groove is formed by means of reactive ion etching.

11. A method as claimed in claim 10, characterized in that the plasma used in the reactive ion etching process is generated in a gas mixture which comprises SiCl$_4$, Ar and CH$_4$.

12. An optoelectronic semiconductor device comprising an array of at least a first and a second semiconductor diode laser and with a semiconductor body which comprises a semiconductor substrate of a first conductivity type on which a semiconductor layer structure is situated which comprises at least in that order: a first cladding layer of the first conductivity type, an active layer in which a first and a second active region of the first and the second laser, respectively, are present, and a second cladding layer of a second conductivity type opposed to the first, the first and the second cladding layer being provided with means for electrical connection of the first and the second laser which are mutually separated by a groove which extends from the surface of the semiconductor body down into the substrate, characterized in that: the groove is situated within the substrate for a major portion (d) of its depth (D) in that the groove extends only partially through said substrate and the groove defines an empty void providing thermal isolation between the respective substrate portions of the first and second active regions.

13. A method of manufacturing an optoelectronic semiconductor device which comprises an array of at least two semiconductor diode lasers, whereby a semiconductor body is formed in that on a semiconductor substrate a semiconductor layer structure is provided comprising in that order a first cladding layer of a first conductivity type, an active layer and a second cladding layer of a second conductivity type opposed to the first, after which the cladding layers are provided with means for electrical connection and a groove is formed in the semiconductor body extending from the surface down into the substrate, while on either side of this groove a first and a second active region are formed in the active layer, characterized in that: the groove is formed so deep that a major portion of the groove is situated within the substrate and in that the groove extends only partially through said substrate and the groove is not filled with material so as to define an empty void which provides thermal isolation between the respective substrate portions of the first and second active regions.

14. An optoelectronic semiconductor device as claimed in claim 12, characterized in that the portion (d) of the groove situated within the substrate is at least approximately 3 μm deep.

15. An optoelectronic device as claimed in claim 14, characterized in that the distance from the first to the second active region is between approximately 15 and 50 μm, and the width of the groove lies between approximately 5 μm and a width which is approximately 10 μm smaller than the distance between the first and second active region.

16. An optoelectronic semiconductor device as claimed in claim 12, characterized in that the portion (d) of the groove situated within the substrate is at least approximately 10 μm deep.

17. An optoelectronic device as claimed in claim 16, characterized in that the distance from the first to the second active region is between approximately 15 and 50 μm, and the width of the groove lies between approximately 5 μm and a width which is approximately 10 μm smaller than the distance between the first and second active region.

18. An optoelectronic device as claimed in claim 12, characterized in that the distance from the first to the second active region is between approximately 15 and 50 μm, and the width of the groove lies between approximately 5 μm and a width which is approximately 10 μm smaller than the distance between the first and second active region.

19. An optoelectronic semiconductor device having at least a first and second semiconductor diode laser, said device comprising:

a semiconductor substrate and a layer structure on said substrate, said layer structure comprising a first cladding layer adjacent said substrate;

an active layer adjacent said first cladding layer and including a first and a second active region, respectively, of said first and second semiconductor lasers;

a second cladding layer adjacent said active layer;

means coupled to said first and second cladding layers for providing electrical connection to said first and second semiconductor lasers;

said device including a groove defining an empty void and extending between said first and second active regions through said layer structure and into said substrate, said groove having a depth dimension with a major portion situated within said substrate, said major portion along said depth dimension being at least 3 microns, the distance transverse to the depth dimension between said first and second active regions is between approximately 15 and 50 microns, and the width of the groove is between approximately 5 microns and a width which is approximately 10 microns smaller than the distance between the first and second active regions.

20. An optoelectronic semiconductor device as claimed in claim 19, characterized in that the portion (d) of the groove situated within the substrate is at least approximately 10 μm deep.

* * * * *